United States Patent [19]
Wright

[11] Patent Number: 4,509,183
[45] Date of Patent: Apr. 2, 1985

[54] BIDIRECTIONAL TRANSITION COUNTER WITH THRESHOLD OUTPUT

[75] Inventor: Fred R. Wright, San Pedro, Calif.

[73] Assignee: Helene R. Wright, San Pedro, Calif.

[21] Appl. No.: 418,694

[22] Filed: Sep. 16, 1982

[51] Int. Cl.³ ............... H03K 23/04; H03K 23/08; G11C 19/28

[52] U.S. Cl. .................... 377/125; 377/69; 377/104; 377/107; 377/126

[58] Field of Search .......... 377/33, 34, 45, 69, 377/104, 106, 107, 111, 118, 119, 125, 126

[56] References Cited

U.S. PATENT DOCUMENTS

| | | | |
|---|---|---|---|
| 3,277,380 | 10/1966 | Paufve | 377/111 X |
| 3,295,063 | 12/1966 | Felcheck et al. | 377/111 X |
| 3,548,167 | 12/1970 | Emde | 377/104 |
| 3,588,475 | 6/1971 | Scott | 377/126 X |
| 4,075,464 | 2/1978 | Davies, Jr. | 377/111 X |

FOREIGN PATENT DOCUMENTS

| | | | |
|---|---|---|---|
| 133360 | 11/1978 | Japan | 377/126 |
| 87934 | 7/1981 | Japan | 377/33 |
| 89329 | 6/1982 | Japan | 377/118 |
| 281002 | 9/1970 | U.S.S.R. | 377/33 |

OTHER PUBLICATIONS

Cheng et al., "Up/Down Ripple Counter", *IBM* Tech. Discl. Bull., vol. 24, No. 9, pp. 4709–4713, 2/82.

*Primary Examiner*—Larry N. Anagnos

[57] ABSTRACT

A linear array of bistable data latches and logic gates arranged to count the binary transitions, both low to high and high to low, of a clock signal and provide a threshold style output code, characterized along the array by high logic states on one side of the threshold point and low logic states on the opposite side. Each latch in the array is permitted to set when a clock transition occurs after the preceding latch has set or to reset when a clock transition occurs after the succeeding latch has reset. Clock phasing and count enable/disable logic may be included along with direct set/reset inputs in order to accomplish parallel and/or ripple preset/clear functions or other output code modifications.

6 Claims, 8 Drawing Figures

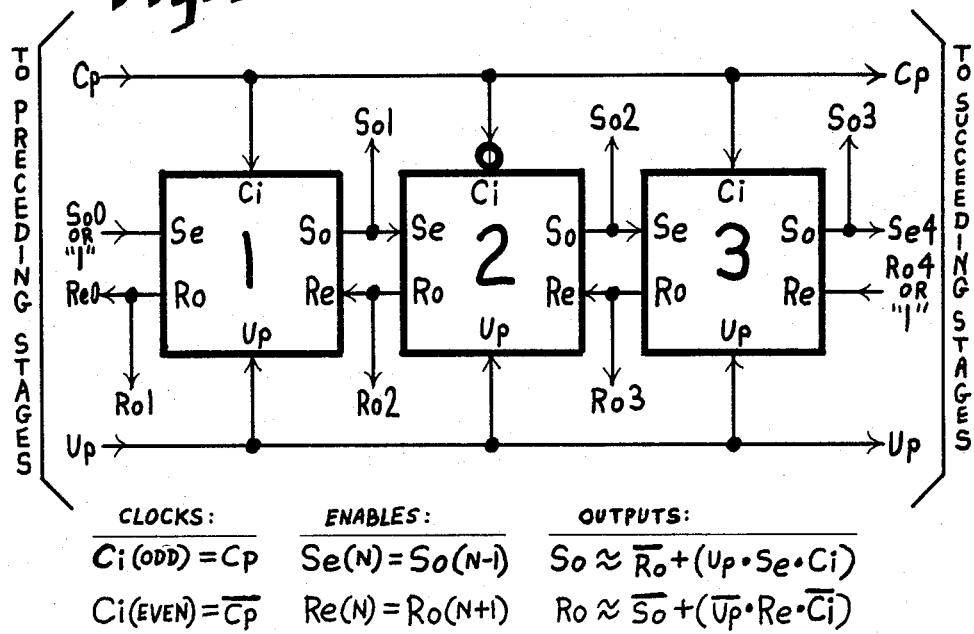

Fig. 1

CLOCKS:
$\overline{Ci(ODD)} = Cp$
$Ci(EVEN) = \overline{Cp}$

ENABLES:
$Se(N) = So(N-1)$
$Re(N) = Ro(N+1)$

OUTPUTS:
$So \approx \overline{Ro} + (Up \cdot Se \cdot Ci)$
$Ro \approx \overline{So} + (\overline{Up} \cdot Re \cdot \overline{Ci})$

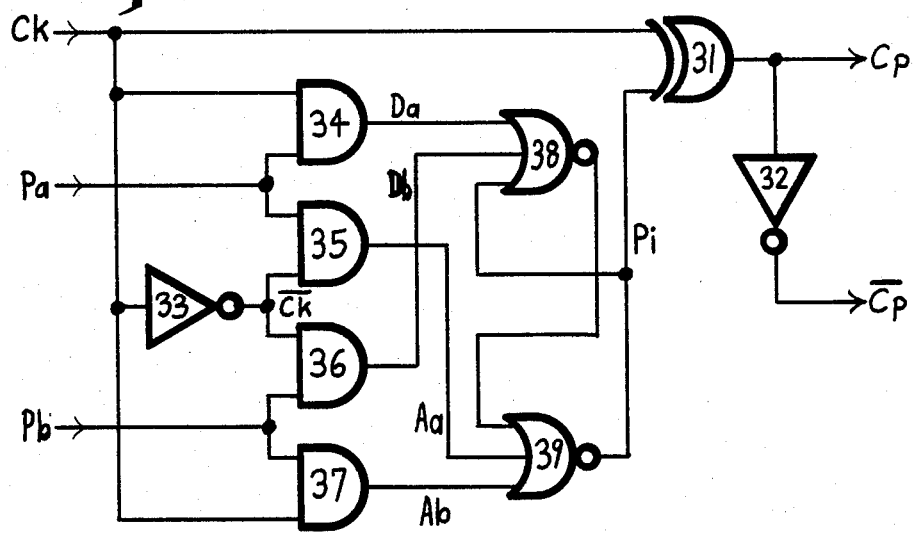

Fig. 6

AGREEMENTS:
$\overline{Aa} = Pa \cdot \overline{Ck}$
$Ab = Pb \cdot Ck$

DISAGREEMENTS:
$Da = Pa \cdot Ck$
$Db = Pb \cdot \overline{Ck}$

PHASE RESULTS:
$Pi = \overline{Aa} \cdot \overline{Ab} \cdot (Da + Db + Pi)$
$Cp = Ck \oplus Pi$

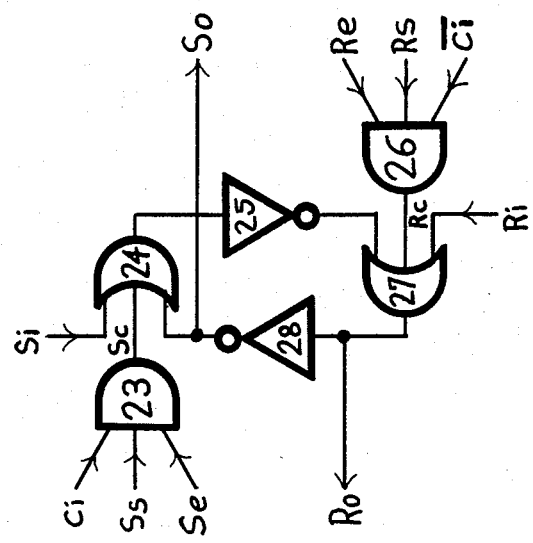
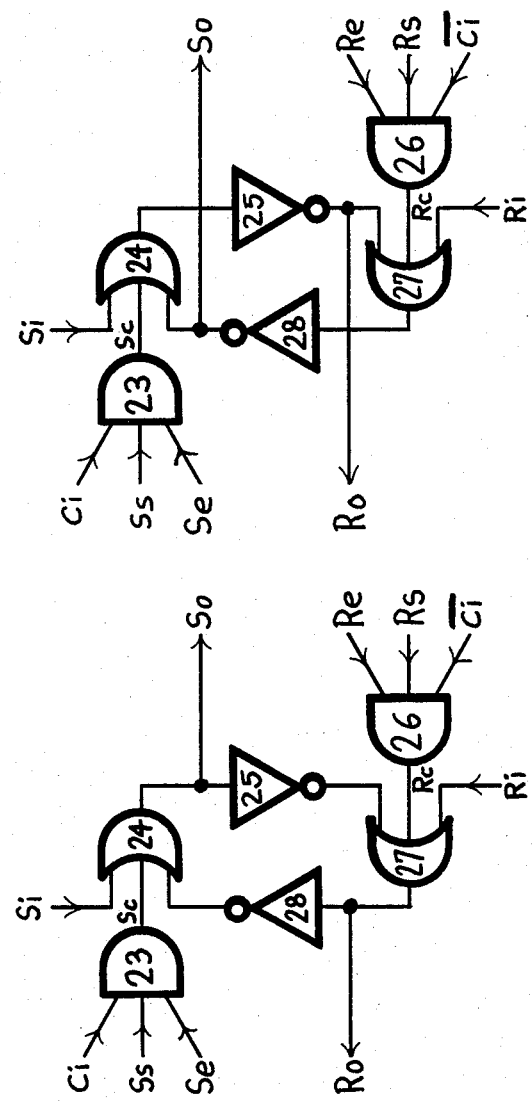

BIDIRECTIONAL TRANSITION COUNTER WITH THRESHOLD OUTPUT

BACKGROUND OF THE INVENTION

A variety of logic schemes have been devised for counting purposes in the prior art, each method oriented toward accomplishing specific goals relating to input format, output format and speed. Binary weighted counting is most commonly used since if offers high efficiency in terms of the number of count states, $2^b$, that can be represented by a given number of bits or stages and construction is reasonably simple, however decoding individual count states is not particularly easy and most binary weighted counters exhibit discontinuities resulting from a combination of propagation delays and the frequent need for multiple bits to change simultaneously.

Discontinuities may be eliminated by use of a cyclic or Gray code in which only one bit changes state at a time, however this method tends to complicate both the counting scheme and the interpretation of its output. Another method of avoiding discontinuities is by use of a threshold format, which is not as efficient in terms of the number of count states, $b+1$, that can be represented by a given number of bits or stages, but offers simple output decoding and is suitable where a limited number of count states are needed. The threshold format is characterized by a linear series of outputs with all high logic states on one side of the threshold point and all low logic states on the opposite side and can progress one bit at a time from all low to all high as the threshold point advances. This format happens to be well suited to non-linear digital to analog conversion and various other applications.

Most counting schemes are designed to advance the output code only on half of the clock transitions, this poses a substantial limitation in certain applications where a higher resolution of the clock signal is needed. The resolution can be doubled by counting on both positive and negative transitions of the clock line, this is particularly useful with a symmetrical clock signal.

OBJECT AND SUMMARY OF THE INVENTION

The object of the present invention is to provide a simple method of assembling digital logic elements in order to produce a threshold style counting array capable of incrementing by one bit, up or down, on each clock transition.

The concept includes a linear array of R/S latches and associated logic elements arranged in a manner such that each latch can be made to set when the next clock transition occurs after the preceding latch has set or to reset when the next clock transition occurs after the succeeding latch has reset. Clock phasing and count enable/disable provisions may be used with any combination of direct set/reset inputs for purposes of count sequence modifications.

BRIEF DESCRIPTION OF THE DRAWINGS

FIG. 1 is a block diagram showing the fundamental logic relationships involved in the counting array.

FIGS. 3,4,5 illustrate several of the possible logic forms which may be used to construct the counting elements or stages of FIG. 2.

FIG. 6 shows a logic assembly which may be used to adjust the clock phase in FIG. 2.

DETAILED DESCRIPTION OF THE INVENTION

Figure 2:
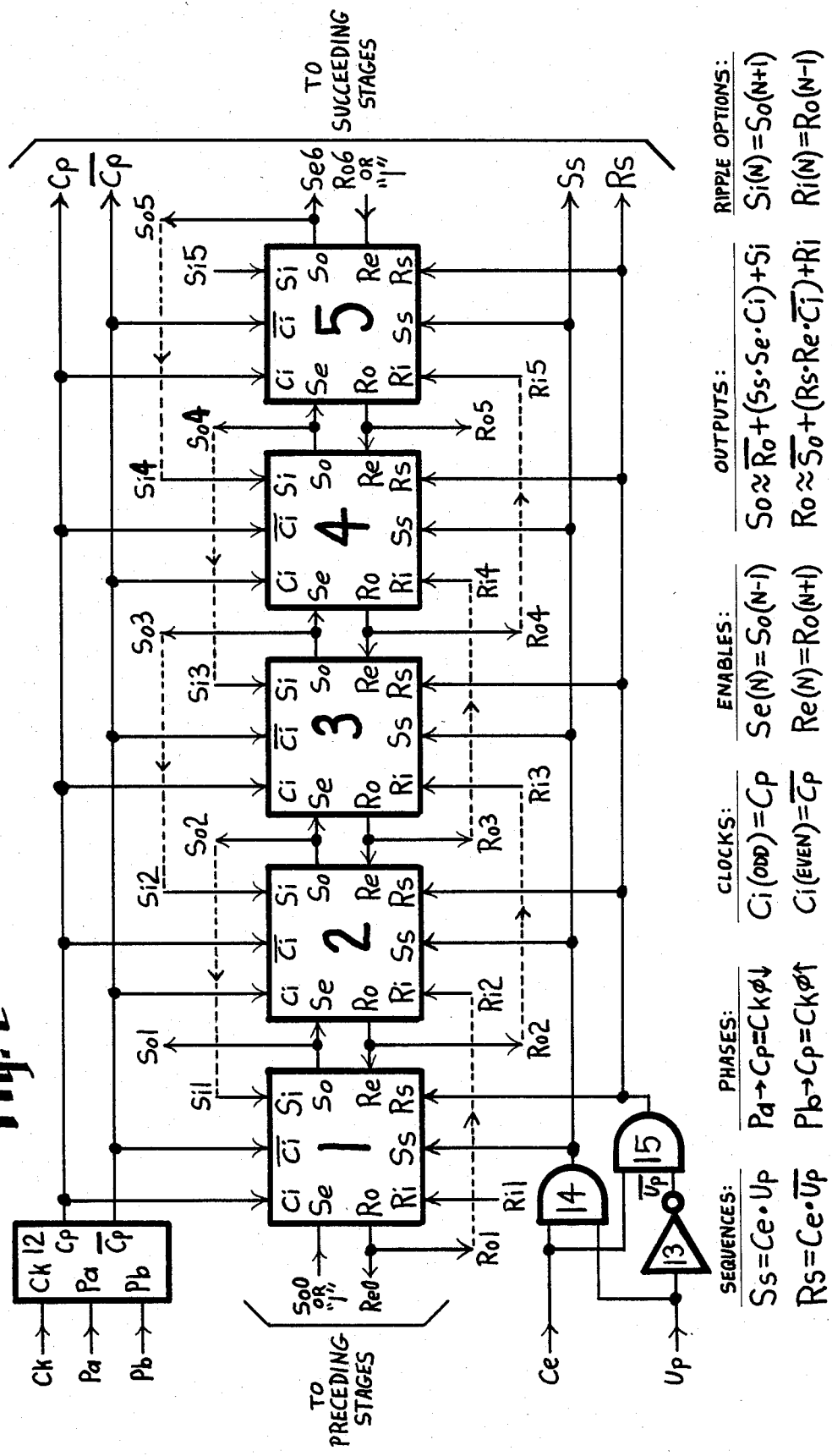
FIG. 2 shows a preferred embodiment of the present invention incorporating clock phasing, count enable and direct set/reset options.

The logic theory and implementation of the present invention will be described in terms of positive logic with reference to FIGS. 1 through 8 and tables I and II. It should be recognized that the principles of this invention can also be achieved in negative logic or in a combination of positive and negative logic, depending on the fabrication technology to be implemented; for example, it can be advantageous to alternate logic polarity and alternate NAND and NOR type stages where CMOS technology is to be applied.

In describing the invention a number of signals will be referred to which are considered to be true during a high logic state and false during a low logic state. Boolean relationships among signals are indicated below each logic diagram in terms of these standard notations:

$\overline{X}$=NOT X—complement of X
·=AND
+=OR
$\oplus$=XOR—exclusive OR

FIG. 1 is a block diagram illustrating the primary signals involved in the present invention where:

Ci=Clock input to stages
Cp=Clock—phased
Re=Reset enable—clocked
Ro=Reset output
Se=Set enable—clocked
So=Set output
Up=Up count direction Blocks 1, 2, 3 represent gated R/S latching stages each of which is supplied with signals indicating the status of the two adjacent stages, Se from the preceding stage and Re from the succeeding stage. Each counter stage may also be supplied with the Up signal which is used to select the direction in which counting is to occur where a high state selects count up or stage setting, or a low state selects count down or stage resetting. A clock signal Ci controls the time at which counting occurs where a high state permits setting and a low state permits resetting, so that a change in direction, Up, while the clock, Ci, is stable will not cause an immediate change in the state of the latching stage. In the counter array Ci is derived from Cp in a manner which effectively inverts the signal to alternate stages so that only one stage at a time can set or reset from a single clock transition. A combination of Up and Se and Ci will normally cause a stage to set So high and Ro low. A combination of $\overline{Up}$ and Re and $\overline{Ci}$ will normally cause a stage to reset Ro high and So low. Ro and So generally exhibit complementary latched logic states indicating the status of that counter stage.

The overall operation of the counter array in FIG. 1 may be better understood by tracing it from an initial condition of all latches in the reset state, that is all So=0 and all Ro=1. Assume that Up=1 and that a clock signal is applied. The portion of the array shown in the figure will remain in the reset state until the preceding stage sets causing Se1 to become 1. This enables the next clock transition, Cp high, to set So1 to 1 which in turn causes the Se2 input of the next stage to go to 1 which then enables the next clock transition, Cp low, to set So2 to 1 causing Se3 to enable the next Cp high to set So3 to 1. This process continues in an identical manner to the end of the array, advancing the set state by one stage on each clock transition as long as the up direction is in effect. The resulting output sequence is in a threshold format of set stages on one side of a threshold point and reset stages on the opposite side.

Counting down is accomplished by putting Up at 0 and applying a clock signal. Assume that the array shown in FIG. 1 is all in the set state, that is all So=1 and all Ro=0. The portion of the array shown in the figure will remain in the set state until the succeeding stage resets causing Re3 to become 1. This enables the next clock transition, Cp low, to reset Ro3 to 1 which in turn causes the Re2 input of the next stage to go to 1 which then enables the next clock transition, Cp high, to reset Ro2 to 1 causing Re1 to enable the next Cp low to reset Ro1 to 1. This process continues in an identical manner to the end of the array, advancing the reset state by one stage for each clock transition as long as the count down direction is in effect, again progressing in the threshold format.

FIG. 2 shows a preferred embodiment of the present invention will expands upon the basic concept of FIG. 1 and incorporates these additional logic signals:

Ce=Count enable
Ck=Clock—unphased
Pa=Phase 'a' select—Cp low
Pb=Phase 'b' select—Cp high
Ri=Reset input—direct
Rs=Resetting sequence enable
Si=Set input—direct
Ss=Setting sequence enable The counting process for FIG. 2 is identical to that described for FIG. 1 provided that Ce is high and all Si and Ri are low. Each stage in the array is permitted to set when a Cp clock transition occurs after the preceding stage has set during count up, or to reset when a Cp clock transition occurs after the succeeding stage has reset during count down. Direction, Up, may be changed while the clock signal is stable and the change will not alter the array output code until the next clock transition occurs. Table I provides a summary of the normal counting sequences for the array of FIG. 2 where the indicated direction is selected prior to occurrence of the indicated clock state.

TABLE I

UP/DOWN COUNTING SEQUENCES

| Time | 0 | 1 | 2 | 3 | 4 | 5 | 6 | 7 | 8 | 9 | 10 |
|---|---|---|---|---|---|---|---|---|---|---|---|
| Cp | 0 | 1 | 0 | 1 | 0 | 1 | 0 | 1 | 0 | 1 | 0 |
| Up | 0 | 1 | 1 | 1 | 1 | 1 | 0 | 0 | 0 | 0 | 0 |
| So5 | 0 | 0 | 0 | 0 | 0 | 1 | 0 | 0 | 0 | 0 | 0 |
| So4 | 0 | 0 | 0 | 0 | 1 | 1 | 1 | 0 | 0 | 0 | 0 |
| So3 | 0 | 0 | 0 | 1 | 1 | 1 | 1 | 1 | 0 | 0 | 0 |
| So2 | 0 | 0 | 1 | 1 | 1 | 1 | 1 | 1 | 1 | 0 | 0 |
| So1 | 0 | 1 | 1 | 1 | 1 | 1 | 1 | 1 | 1 | 1 | 0 |
| Count | 0 | 1 | 2 | 3 | 4 | 5 | 4 | 3 | 2 | 1 | 0 |

(Se1, Re5, and Ce = 1; all Si and Ri = 0)

The array of FIG. 2 includes input Ce, which enables counting in the high logic state and disables counting when it is put in the low state by blocking the generation of the setting or resetting sequence enable signals. While Ce is in its high state Ss is the complement of Rs so that setting or resetting can occur depending on the state of Up. These functions are provided by direction inverter 13 combined with AND gate 15 to produce Rs, and AND gate 14 directly produces Ss for application to the counting array.

Direct latch set, Si, and reset, Ri, inputs shown in FIG. 2 increase the flexibility of the counting array by making it possible for counting stages to be individually or collectively set or reset independent of clocking. This capability is particularly useful for clearing or presetting the array and can also be used in ripple configurations, as indicated in FIG. 2, to correct unwanted counter states which do not conform to the threshold format; for example if all stages of the counter are in a reset state and stage 4 receives a set, Si4, signal, the counter adopts an unacceptable output So sequence of 0,0,0,1,0 which can be corrected to the valid sequence of 1,1,1,1,0, by permitting each set stage to direct set the preceding stage. Correction could be performed in the opposite direction by permitting each reset stage to directly reset the succeeding stage, this would return the output sequence to 0,0,0,0,0. The ripple set and reset options do not interfere with normal counting procedure since they only serve to confirm the normal threshold format. In certain cases it may be desirable to provide multiple Si or Ri inputs to a counting stage, depending on the application.

The ability to directly set or reset individual stages within the counting array raises a potential problem in that the state of the clock signal might not be in agreement with the threshold position generated by an Si or Ri signal, therefore item 12 in FIG. 2 is provided as a clock phase control which may be used to correct the clock, Ck, to the proper clock phase Cp. A high signal on Pa causes Cp to go to a low phase or a high signal on Pb causes Cp to go to a high phase. When the phasing request signal is removed the clock, Cp, remains locked as either Ck or $\overline{Ck}$.

FIGS. 3, 4, 5 illustrate several of the possible logic forms which may be used to construct individual counting stages, other configurations are possible including NAND type latching. Each of these figures offers a complete counting stage which is fully compatible with the signals provided for each stage in FIG. 2. These figures include additional signals:

Sc=Set—clocked
Rc=Reset—clocked

The counting stages in FIGS. 3, 4, 5 are accompanied by their Boolean equations, which initially appear to be quite different, but actually only differ in terms of response to conflicting input signals involving Ri and/or Si. The only difference between the three logic forms is in the origins of the output signals Ro and So, which can be chosen according to the desired priority of the direct set/reset inputs. Any number of Ri/Si inputs may be added and any unused signals may be deleted depending on the particular application. Each of the illustrated logic forms includes a conventional R/S latch consisting of gates 24 and 27 and inverters 25 and 28 as needed. Gate 24 normally causes the stage to set from either an Sc or Si signal and gage 27 normally causes the stage to reset from either an Rc or Ri signal. The clocked signals are supplied by gates 23 and 26 which prevent more than one of these signals from occurring at any time. Gate 23 generates Sc only when Ss, Se, and Ci are all high and gate 26 generates Rc only when Rs and Re are high and Ci is low. Once a stage has set Sc and Si no longer have any effect and once a stage has reset Rc and Ri no longer have an effect on the outputs. The desired counting array is produced by assembling these counter stages in a linear array with alternating clock polarity as shown in FIG. 2.

As an example of the purpose of the phase control, item 12 in FIG. 2, consider a case where stage 1 of the counter has just set during normal counting; this would occur, according to the conditions above, when Ss, Se, and Ci are all high. Now a direct reset, Ri1, signal is applied and a conflict arises because Ri1 is attempting to reset the stage while the clocked signal is still attempting to maintain the set condition, which should not now occur until the next clock transition. A solution to the problem is to invert the clock signal Cp to a nonconflicting state in cases where this type of conflict can arise.

FIG. 6 details a method of phase control, as in item 12 of FIG. 2, which is capable of reinterpreting clock Ck in order to produce either a high or a low phase on Cp in order to obtain clock phase compatibility with the threshold position resulting from any interruption in the normal counting sequence. The following additional logic signals apply:

Aa=Agreement 'a' phase
Ab=Agreement 'b' phase
Da=Disagreement 'a' phase
Db=Disagreement 'b' phase
Pi=Phase invert The Pa and Pb phase selection inputs are normally maintained in a low state, producing low states on all A and D lines and therefore having no effect on the phase latch made up of gates 38 and 39. When a low phase is requested by putting Pa in a high state either Aa or Da will go to a high state depending on the current state of the clock Ck. If Ck is in a low state then gate 35 causes Aa to go high, which causes the phase latch to set Pi low. If Ck is in a high state then gate 34 puts Da high causing the phase latch to set Pi high. Gate 31 combines Ck and Pi in an exclusive OR to produce clock Cp in the low phase as requested by Pa. When a high phase is requested by putting Pb in a high state either Ab or Db will go high causing the phase latch to set Pi in a similar manner to the above, but resulting with Cp in the high phase. When a phase request signal is removed the phase latch maintains its condition, causing Cp to continue to appear as either Ck or $\overline{Ck}$. A summary of the phasing operation is given in table II.

TABLE II

| Time | CLOCK PHASE CONTROL | | | | | | | | | | | |
|---|---|---|---|---|---|---|---|---|---|---|---|---|
| | 0 | 1 | 2 | 3 | 4 | 5 | 6 | 7 | 8 | 9 | 10 | 11 |
| Ck | 0 | 1 | 0 | 1 | 0 | 1 | 0 | 1 | 0 | 1 | 0 | 1 |
| Pa | 1 | 0 | 0 | 1 | 0 | 0 | 0 | 0 | 0 | 0 | 0 | 0 |
| Pb | 0 | 0 | 0 | 0 | 0 | 0 | 1 | 0 | 0 | 1 | 0 | 0 |
| Aa | 1 | 0 | 0 | 0 | 0 | 0 | 0 | 0 | 0 | 0 | 0 | 0 |
| Ab | 0 | 0 | 0 | 0 | 0 | 0 | 0 | 0 | 0 | 1 | 0 | 0 |
| Da | 0 | 0 | 0 | 1 | 0 | 0 | 0 | 0 | 0 | 0 | 0 | 0 |
| Db | 0 | 0 | 0 | 0 | 0 | 0 | 1 | 0 | 0 | 0 | 0 | 0 |
| Pi | 0 | 0 | 0 | 1 | 1 | 1 | 1 | 1 | 0 | 0 | 0 | 0 |
| Cp | 0 | 1 | 0 | 0 | 1 | 0 | 1 | 0 | 1 | 1 | 0 | 1 |

Figure 7:
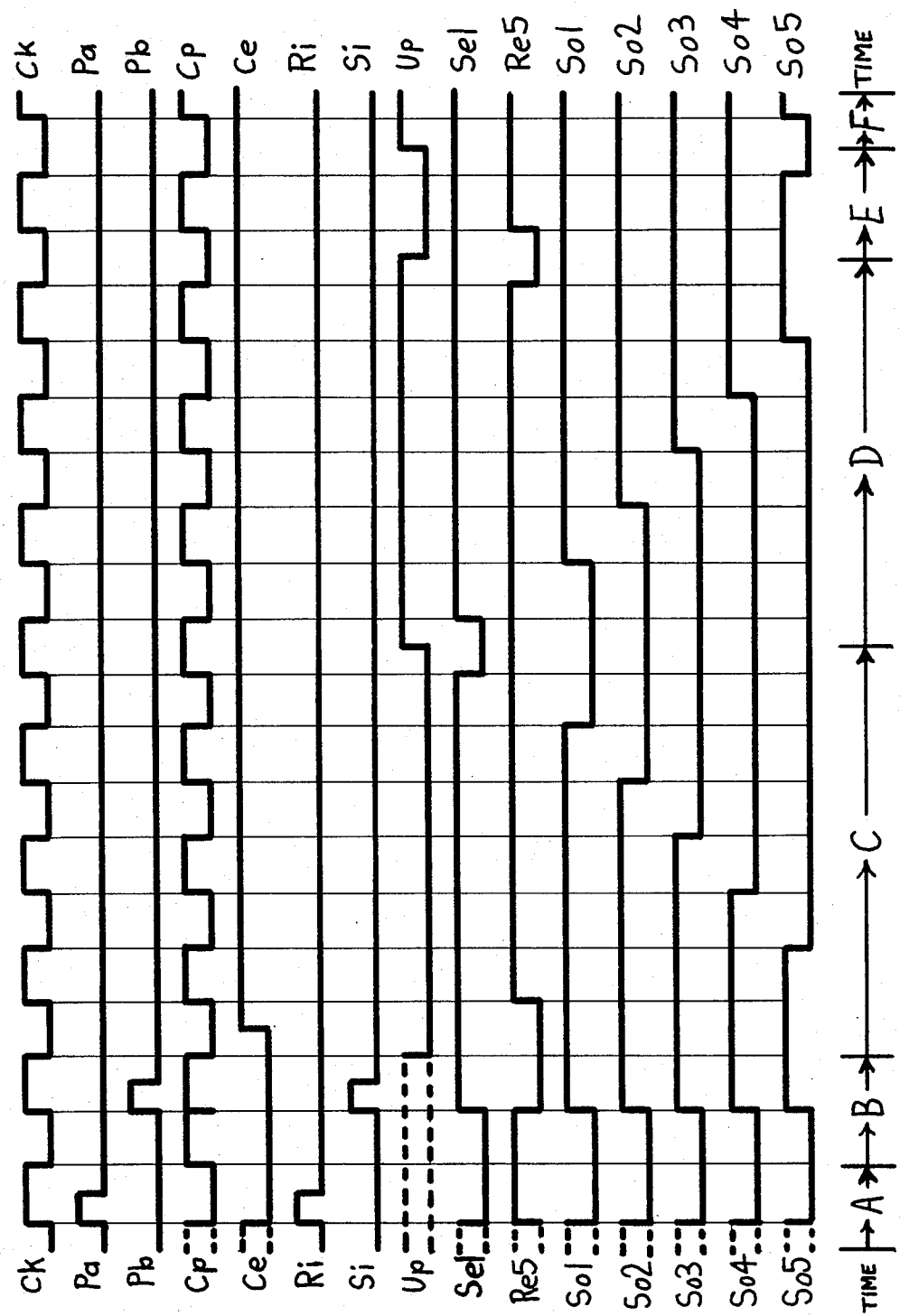
FIG. 7 is a timing diagram which demonstrates the operation of the counting array in FIG. 2.

FIG. 7 is a timing diagram which demonstrates typical signal sequences encountered during operation of an array such as that of FIG. 2. It is worth noting some timing restrictions that should be observed; Up and Ce should change state only while the clock is stable, and Pa and Pb should be in a low state prior to a clock transition which is intended to produce a count.

In time period 'A' the initial random condition of the array is cleared by applying Ri signals to all stages, this results in all stages being reset as shown for So1 to So5. A simultaneous phasing request Pa is also applied which phases Cp to a low state.

In time period 'B' Si signals are applied to all stages, this results in all stages being set as shown for So1 to So5. A simultaneous phasing request Pb is also applied which phases Cp to a high state.

In time span 'C' the count down direction is selected by putting Up low, the counter array is enabled by putting Ce high and the count down begins after Re5 goes high. Each consecutive stage goes to the reset state on the next clock transition after the succeeding stage has reset.

The direction, Up, is switched high in 'D' to permit a count up, which begins after Se1 goes high. Each consecutive stage goes to the set state on the next clock transition after the preceding stage has set.

'E' shows the beginning of another counter down sequence which is quickly switched back to count up in 'F', demonstrating the ability to reverse count direction on the next clock transition.

Figure 8:
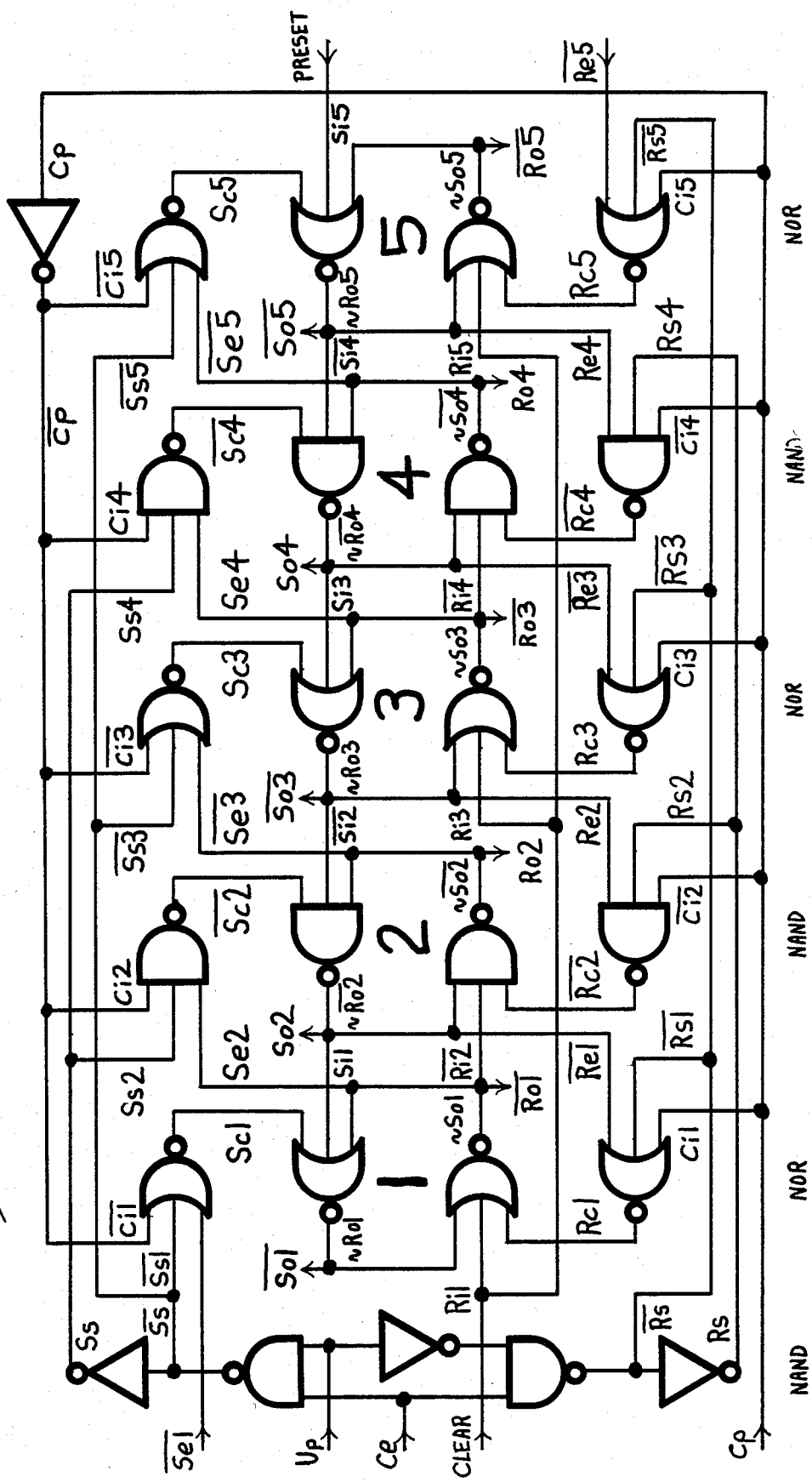
FIG. 8 is a NAND/NOR implementation of the invention.

FIG. 8 shows a NAND/NOR version of the counting array which takes advantage of alternating positive and negative logic within the array in order to minimize the component requirements for CMOS fabrication. The NAND/NOR arrangement operates in exactly the same way as the previous implementations with the understanding that some of the logic signals are of inverse polarity as indicated by the drawing, in view of this it will be realized that table I and FIG. 7 and all previous discussion apply equally well to the array of FIG. 8.

This particular configuration utilizes the ripple code correction option whereby each set stage directly sets the preceding stage. Therefore a high signal on Si5 will cause a setting ripple through the preceding stages which is useful for presetting the counter.

A high signal on Ri1 is also applied directly to Ri3 and Ri5 causing all NOR type latches to reset, these reset states are then passed to the succeeding NAND type latches causing them to also reset, this results in a semiparallel resetting capability which is useful for clearing the counter rapidly since there is no accumulated propagation delay as occurs in the ripple presetting discussed above.

The same clock signal polarity is applied to adjacent counting stages in FIG. 8 and is simply interpreted in alternating polarity by the alternating NAND/NOR stages, so during unidirectional counting the only limit on counting speed is the propagation delay to set or reset a single latch.

While the invention has been shown and described in terms of the preferred embodiments it will be understood that changes may be made in the details without departing from the spirit and scope of the invention.

What is claimed is:

1. A transition counter comprising a plurality of three or more counting elements arranged in a linear array;
   each of said counting elements including a bistable latch having one or more input means for "setting" said latch to one of its bistable states, and one or more input means for "resetting" said latch to the other one of its bistable states, and output means for signaling the existing "set" or "reset" bistable state of said latch and thus of the counting element, said "setting" and "resetting" input means to be normally maintained in logic states other than those which induce "set" or "reset" output results;

each of said counting elements having input means for a signal indicating the bistable state of the preceding counting element, and input means for a signal indicating the bistable state of the succeeding counting element, and input means for a signal indicating whether a "setting" count sequence is to occur, and input means for a signal indicating whether a "resetting" count sequence is to occur, and input means for a common clocking signal of effectively complementary logic polarity to adjacent counting elements;

each of said counting elements including first conditional gating means whereby a "setting" signal is applied to the bistable latch during the specific conditions where said "setting" count sequence is indicated, and the signal from the preceding counting element indicates that it is "set", and said common clocking signal is in a preselected logical state;

each of said counting elements including second conditional gating means whereby a "resetting" signal is applied to the bistable latch during the specific conditions where said "resetting" count sequence is indicated, and the signal from the succeeding counting element indicates that it is "reset", and said common clocking signal is in a logical state opposite to said preselected logical state;

the counter being constructed and defined such that each consecutive counting element is permitted to "set" at the clocking transition following the "setting" of the preceding counting element during a "setting" count sequence, or to "reset" at the clocking transition following the "resetting" of the succeeding counting element during a "resetting" count sequence, and wherein a change from one count sequence to the other becomes effective at the next clocking transition;

a threshold is manifest at that point along the array where all preceding counting elements are "set" and all succeeding counting elements are "reset";

said threshold progressing by one counting element in the "setting" or the "resetting" direction on each clocking transition during the appropriate count sequence, thus effectively progressing by two counting elements for each clocking cycle, and producing the sequence of counting states RRR, SRR, SSR, SSS during "setting", or SSS, SSR, SRR, RRR during "resetting", thereby exhibiting one more counting state than the number of counting elements composing the array.

2. A transition counter as defined in claim 1 wherein said signal indicating a "setting" count sequence is the logical inverse of said signal indicating a "resetting" count sequence such that a single signal may be used to indicate which count sequence is to be promoted.

3. A transition counter as defined in claim 1 wherein only one of the two said count sequences is to be used and said conditional gating means relating to the other count sequence may be omitted.

4. A transition counter as defined in claim 1 wherein one of said input means for "setting" said latch is coupled to a signal for indicating the "set" state of the succeeding counting element such that the latch will "set" whenever the succeeding counting element is "set", thus serving to correct deviations from the threshold output format.

5. A transition counter as defined in claim 1 wherein one of said input means for "resetting" said latch is coupled to a signal for indicating the "reset" state of the preceding counting element such that the latch will "reset" whenever the preceding counting element is "reset", thus serving to correct deviations from the threshold output format.

6. A transition counter as defined in claim 1 wherein one of said input means for "setting" said latch or one of said input means for "resetting" said latch may be coupled to a signal for the purpose of directly inducing a "set" or a "reset" bistable state within the counting element, thus serving to modify the preexisting counting state of the array.

* * * * *

UNITED STATES PATENT OFFICE
CERTIFICATE OF CORRECTION

Patent No. 4,509,183     Dated April 2, 1985

Inventor(s) Fred R. Wright

It is certified that error appears in the above-identified patent and that said Letters Patent are hereby corrected as shown below:

Column 1, line 11, "if" should show -- it --;

Column 1, line 13, "bits" should show -- <u>b</u>its --;

Column 4, line 17, "direct" should show -- directly --;

Column 4, line 61, "gage" should show -- gate --;

Column 6, line 18, "counter" should show -- count --.

*Signed and Sealed this*

*Sixteenth* Day of *July 1985*

[SEAL]

*Attest:*

DONALD J. QUIGG

*Attesting Officer*     *Acting Commissioner of Patents and Trademarks*